United States Patent
Cheng et al.

(10) Patent No.: US 9,653,359 B2
(45) Date of Patent: May 16, 2017

(54) BULK FIN STI FORMATION

(71) Applicant: International Business Machines Corporation, Armonk, NY (US)

(72) Inventors: Kangguo Cheng, Schenectady, NY (US); Juntao Li, Cohoes, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/869,066

(22) Filed: Sep. 29, 2015

(65) Prior Publication Data

US 2017/0092544 A1    Mar. 30, 2017

(51) Int. Cl.
| | |
|---|---|
| *H01L 21/82* | (2006.01) |
| *H01L 21/8234* | (2006.01) |
| *H01L 29/66* | (2006.01) |
| *H01L 21/762* | (2006.01) |
| *H01L 21/32* | (2006.01) |
| *H01L 21/311* | (2006.01) |
| *H01L 29/78* | (2006.01) |
| *H01L 29/06* | (2006.01) |
| *H01L 27/088* | (2006.01) |

(52) U.S. Cl.
CPC ........ *H01L 21/823481* (2013.01); *H01L 21/31144* (2013.01); *H01L 21/32* (2013.01); *H01L 21/76224* (2013.01); *H01L 21/823431* (2013.01); *H01L 27/0886* (2013.01); *H01L 29/0649* (2013.01); *H01L 29/66795* (2013.01); *H01L 29/785* (2013.01)

(58) Field of Classification Search
CPC .......... H01L 21/823481; H01L 21/823431
USPC ............................................. 257/401
See application file for complete search history.

(56) References Cited

U.S. PATENT DOCUMENTS

| | | | |
|---|---|---|---|
| 7,141,856 B2 | 11/2006 | Lee et al. | |
| 7,919,335 B2 | 4/2011 | Xiao et al. | |
| 8,022,478 B2 | 9/2011 | Anderson et al. | |
| 8,546,891 B2 * | 10/2013 | Chang | H01L 29/06 257/401 |
| 8,716,786 B2 | 5/2014 | Baumgartner et al. | |
| 8,723,271 B2 * | 5/2014 | Yuan | H01L 21/76224 257/386 |
| 2004/0238897 A1 | 12/2004 | Oishi | |
| 2013/0093026 A1 | 4/2013 | Wann et al. | |
| 2014/0353795 A1 | 12/2014 | Tong et al. | |

(Continued)

OTHER PUBLICATIONS

US 8,508,000, 08/2013, Chang et al. (withdrawn)

*Primary Examiner* — Mark Prenty
(74) *Attorney, Agent, or Firm* — Vazken Alexanian; Michael J. Chang, LLC (57) ABSTRACT

Techniques for STI in fin device structures formed on bulk substrates are provided. In one aspect, a method of forming a fin device in a bulk substrate includes the steps of: forming fins and trenches in between the fins in the bulk substrate; and annealing the bulk substrate in an oxygen ambient under conditions sufficient to form a thermal oxide on sidewalls of the fins and which completely fills the trenches, wherein the thermal oxide forms a STI region between each of the fins. A method of forming a fin device in a bulk substrate is also provided where a deposited STI oxide is used in combination with a thermal oxide. A fin device is also provided.

16 Claims, 5 Drawing Sheets

(56) References Cited

U.S. PATENT DOCUMENTS

| | | | |
|---|---|---|---|
| 2015/0024573 A1* | 1/2015 | Jacob | H01L 29/66628 438/424 |
| 2016/0071757 A1* | 3/2016 | Tsai | H01L 21/76224 438/400 |
| 2016/0126353 A1* | 5/2016 | Jacob | H01L 29/7851 257/192 |

* cited by examiner

STI recess to reveal fins

BULK FIN STI FORMATION

FIELD OF THE INVENTION

The present invention relates to fin device structures, and more particularly, to techniques for shallow trench isolation (STI) in fin device structures formed on bulk substrates.

BACKGROUND OF THE INVENTION

Bulk Fin field-effect transistor (finFET) has become the mainstream complementary metal-oxide semiconductor (CMOS) technology for beyond the 22 nanometer (nm) node. Shallow trench isolation or STI is essential for bulk finFET isolation.

Scaling bulk FinFET requires fin pitch scaling. Fin pitch scaling results in a reduction of STI width and thus the aspect ratio of STI. Filling high aspect ratio STI without voids with dielectric becomes increasingly challenging.

Therefore, there is a need for improved bulk FinFET STI processes.

SUMMARY OF THE INVENTION

The present invention provides techniques for shallow trench isolation (STI) in fin device structures formed on bulk substrates. In one aspect of the invention, a method of forming a fin device in a bulk substrate is provided. The method includes the steps of: forming fins and trenches in between the fins in the bulk substrate; and annealing the bulk substrate in an oxygen ambient under conditions sufficient to form a thermal oxide on sidewalls of the fins and which completely fills the trenches, wherein the thermal oxide forms a STI region between each of the fins.

In another aspect of the invention, another method of forming a fin device in a bulk substrate is provided. The method includes the steps of: forming fins and trenches in between the fins in the bulk substrate; depositing an STI oxide into the trenches, wherein the STI oxide partially fills the trenches such that voids are present within the trenches; and annealing the bulk substrate in an oxygen ambient under conditions sufficient to form a thermal oxide on sidewalls of the fins and filling the voids present within the trenches, wherein STI oxide and the thermal oxide form a STI region between each of the fins.

In yet another aspect of the invention, a fin device is provided. The fin device includes: fins and trenches in between the fins formed in a bulk substrate; and a thermal oxide completely filling the trenches, wherein the thermal oxide forms a STI region between each of the fins.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming void-free shallow trench isolation (STI). The process is self-limiting and is particularly useful in the fabrication of bulk FinFET with a tight fin pitch (with high aspect ratio, i.e., narrow and deep, STIs).

Figure 1:
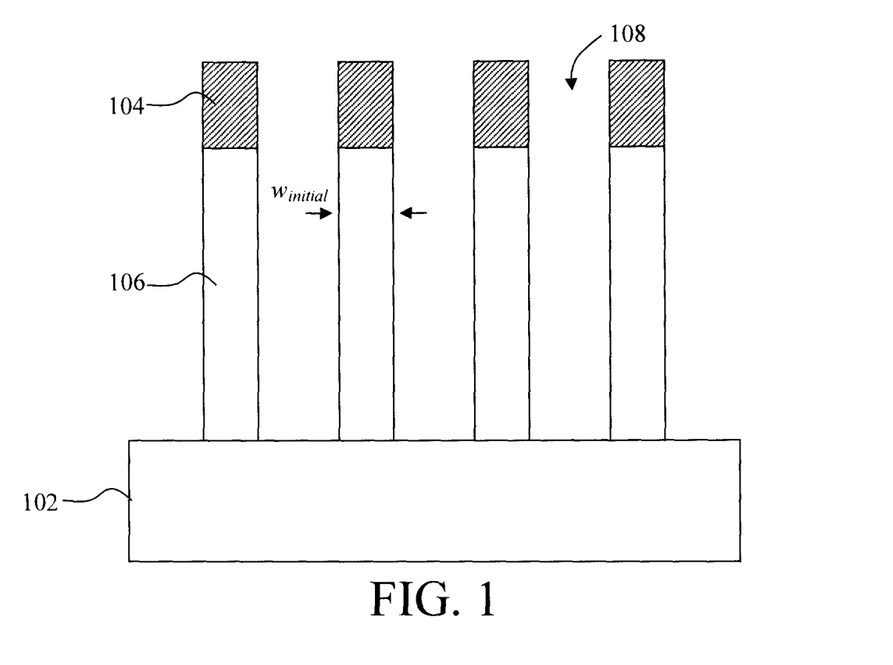
FIG. 1 is a cross-sectional diagram illustrating fins having been formed in the bulk substrate according to an embodiment of the present invention.

As shown in FIG. 1, the process begins with a bulk substrate 102. Suitable substrate materials include, but are not limited to, silicon (Si), strained Si, silicon carbide (SiC), germanium (Ge), silicon germanium (SiGe), silicon-germanium-carbon (SiGeC), Si alloys, Ge alloys, gallium arsenide (GaAs), indium arsenide (InAs), indium phosphide (InP), or any combination thereof.

Fins 106 are then formed in the bulk substrate 102. See FIG. 1. The fins 106 may be formed in the bulk substrate 102 by direct patterning the fins using a standard fin hardmask. For instance, a suitable fin hardmask material may be deposited onto the bulk semiconductor wafer. Standard lithography and etching techniques can then be employed to pattern the hardmask into a plurality of individual fin hardmasks 104. See FIG. 1. The fin hardmasks will mask the footprint and location of the fins 106. Suitable fin hardmask materials include, but are not limited to, a nitride hardmask material such as silicon nitride (SiN).

An etch through the fin hardmasks 104 can then be used to pattern one or more fins 106 in the substrate 102. By way of example only, the fins 106 can be patterned using an anisotropic etching process, such as reactive ion etching or RIE. The RIE etch can be endpointed when the fins 106 have reached a desired depth in the bulk substrate 102.

As shown in FIG. 1, the fin patterning step results in trenches 108 being present between the fins 106. It is in these trenches that an STI oxide will be grown (via a thermal oxidation process) that will serve to isolate the fins. Thus, the trenches 108 may also be referred to herein as STI trenches. Advantageously, since the STI oxide will be formed by thermal oxidation, as compared to conventional processes where an STI oxide is deposited, the present STI oxide can completely fill the STI trenches without any undesirable voids being formed. Namely, with high aspect ratio STI trenches (e.g., trenches having a width of from about 5 nanometers (nm) to about 500 nm, and ranges therebetween, and a depth of from about 10 nm to about 1 micrometer (µm), and ranges therebetween) material being deposited into the trenches can build up at the openings of the trenches, closing off the openings before the trenches are completely filled. As a result, voids (i.e., unfilled spaces) are formed in the trenches. By comparison, the present techniques employ an oxidation process to fill the trenches with an oxide material. Even if the material being formed in the trenches closes off the openings, oxygen ions are able to permeate the material and the growth process continues within the trenches.

Alternatively, the fins 106 may be patterned using a sidewall imaging transfer process or SIT. SIT is particularly advantageous in applications involving fins at a scaled pitch since SIT can be used to pattern features at sub-lithographic dimensions. SIT generally involves first forming one or more mandrels on a substrate (in this case the bulk substrate 102). Sidewall spacers are then formed on opposite sides of the mandrels. The mandrels can then be removed selective to the spacers. The spacers then can be used as fin masks to pattern fins in the substrate. Advantageously, SIT permits the placement of two spacers for each patterned mandrel, thereby doubling the fin pitch.

With whichever process is used to pattern the fins 106, dielectric isolation is needed in the bulk substrate 102 to isolate the fins. As highlighted above, the present process involves a thermal oxidation process to oxidize the sidewalls of the fins 106. A portion of the fin sidewalls will be consumed during this oxidation process. Accordingly, it is desirable to pattern the fins 106 having a width that is slightly larger than the desired final width of the fins to compensate for the width that is lost during the thermal oxidation. For instance, it is desirable to pattern the fins 106 having a width $W_{initial}$ (see FIG. 1) that is from about 10% to about 30%, and ranges therebetween, greater than the desired final width of the fins. According to an exemplary embodiment, the fins have a starting width $W_{initial}$ of from about 5 nm to about 100 nm, and ranges therebetween, and a final width of from about 2 nm to about 90 nm, and ranges therebetween.

In order to protect the fins during the subsequent thermal oxidation process, it is desirable to leave the fin hardmasks 104 in place following the fin etch. See FIG. 1. This will prevent any undesirable loss in fin height through the oxidation.

Figure 2:
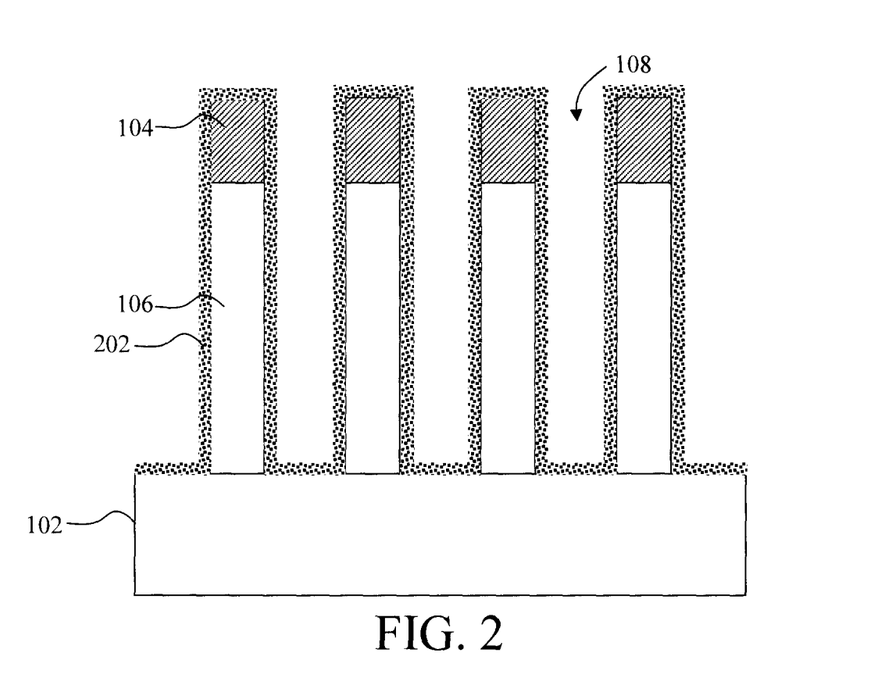
FIG. 2 is a cross-sectional diagram illustrating an optional thin, conformal oxide liner having been formed on sidewalls of the fins according to an embodiment of the present invention.

Next, an optional oxide liner 202 is formed on the fins. See FIG. 2. The liner here can be used to adjust the gap between fins so that for fins with wide gaps, the reduced fin gap can still be fully filled by oxidation. As shown in FIG. 2, the oxide liner 202 is formed as a thin conformal layer lining the sidewalls of the fins 106. According to an exemplary embodiment, the oxide liner 202 is formed from an oxide material such as silicon dioxide ($SiO_2$) that is deposited on the fins 106 using a conformal deposition process such as chemical vapor deposition (CVD) or atomic layer deposition (ALD). The oxide liner preferably has a thickness of from about 1 nanometer (nm) to about 5 nm, and ranges therebetween, e.g., from about 2 nm to about 4 nm, and ranges therebetween.

A thermal oxidation process is then performed to oxidize the sidewalls of the fins 106 to form a thermal oxide 302 within the trenches 108. See FIG. 3. This thermal oxidation process is carried out by annealing the substrate in an oxygen ambient under conditions sufficient to form the thermal oxide 302 on the sidewalls of the fins 106 that completely fills the trenches 108. According to an exemplary embodiment, the thermal oxidation is carried out at a temperature of from about 750° C. to about 1,500° C., and ranges therebetween, for a duration of from about 10 seconds (sec) to about 10 hours, and ranges therebetween.

It is notable that the formation of the thermal oxide in the trenches 108 is a self-limiting process. Namely, due to volume expansion, the thermal oxide will expand laterally in from each of the fin sidewalls until the thermal oxide growing on opposing fin sidewalls meets in the trenches 108. See FIG. 3. Thus, as provided above, even if the openings to the trenches get closed off, the thermal oxide will continue to grow within the trenches until the trenches are completely filled and thus void-free.

While the fin hardmasks serve to protect the tops of the fins, as provided above the thermal oxidation process will thin (i.e., reduce the width of) the fins 106. Specifically, a portion of the fins sidewalls is consumed by the thermal oxide growth. For instance, if the fins are formed from Si, then during the oxidation process a portion of the Si fin will be converted to $SiO_2$. This concept highlights another unique aspect of the present process. That is the thermal oxide growth produces (111) crystallographic planes at the base of the fins. See FIG. 3. As such one can readily distinguish the present fin structures from those produced using a conventional deposited STI oxide since in the case of a deposited oxide the base of the fins would not have a faceted shape.

Figure 3:
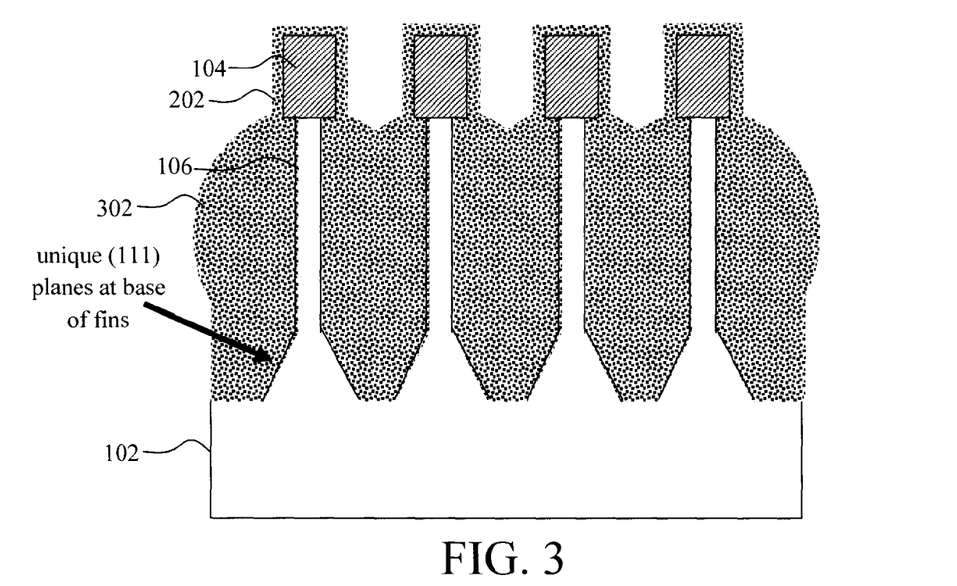
FIG. 3 is a cross-sectional diagram illustrating a thermal oxidation process having been performed to oxidize the sidewalls of the fins to form a thermal oxide within the trenches according to an embodiment of the present invention.

As shown in FIG. 3, the width of the fins 106 post-oxidation is less than the starting width of the fins. Compare FIG. 3 with FIG. 1. As described above, one can compensate for this loss in width by initially patterning thicker fins.

Figure 4:
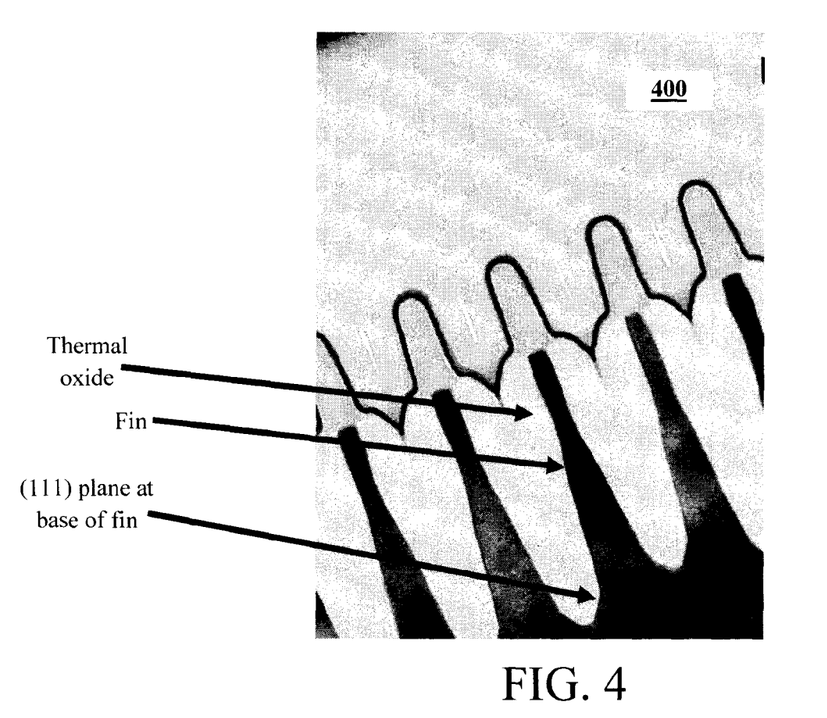
FIG. 4 is an image of a fin structure sample prepared according to an embodiment of the present invention.

FIG. 4 is an image 400 of a fin structure sample prepared using the present techniques. As shown in image 400, the thermal oxide completely fills the spaces (i.e., the STI trenches) between the fins. Note that there are no voids present in the thermal oxide. Further, image 400 illustrates how the fins are thinned by the oxidation process, and which results in the unique (111) plane present at the base of each of the fins.

Once the thermal oxide 302 has been formed in the trenches 108, the oxide growth will cease. To permit further processing of the fin structure, according to an exemplary embodiment, an oxide 502 is next deposited to fill the gaps between the fin hardmasks 104. See FIG. 5. The purpose of this oxide 502 is to fill the gaps between fins and fin hardmasks. Then a CMP process can be done to planarize the structure (stops on the top of nitride hardmask). The oxide fill and CMP steps would ensure the oxide between fins has the same top surface level so that when the active portion of fins is revealed by etching (to proceed to FIG. 6), one can have a uniform fin reveal height.

According to an exemplary embodiment, the oxide 502 is a flowable oxide or FOX.

Suitable flowable oxide materials are available, for example, from Dow Corning Corporation, Midland Mich. Flowable oxides can be cast onto a substrate, e.g., using spin-coating, and then heated to melt and flow the film. This will insure complete coverage around and in between the fin hardmasks 104.

Figure 5:
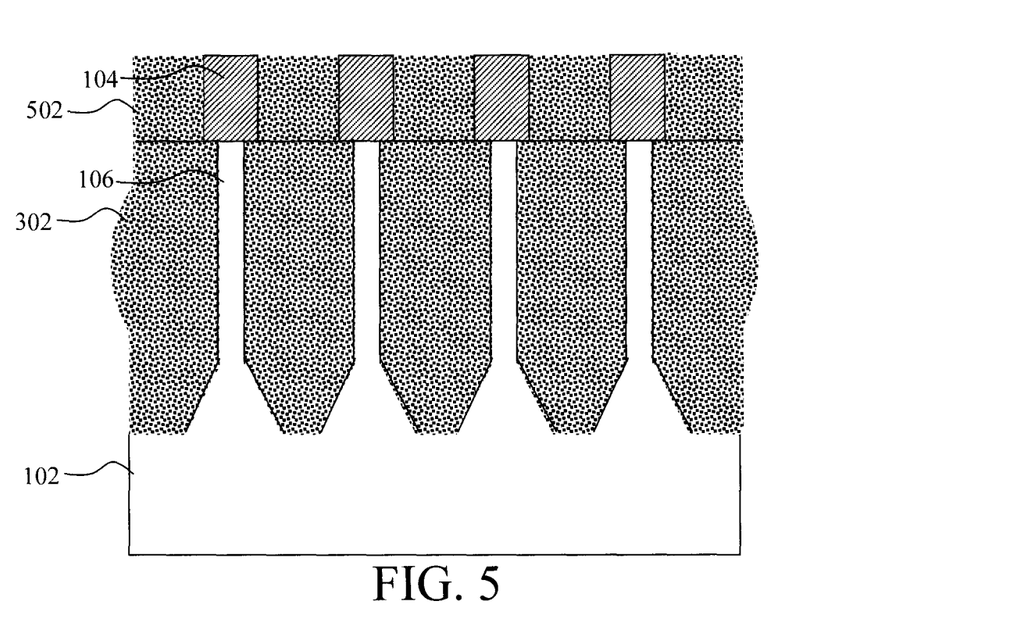
FIG. 5 is a cross-sectional diagram illustrating an oxide having been deposited to fill the gaps between the fins hardmasks according to an embodiment of the present invention.
Figure 6:
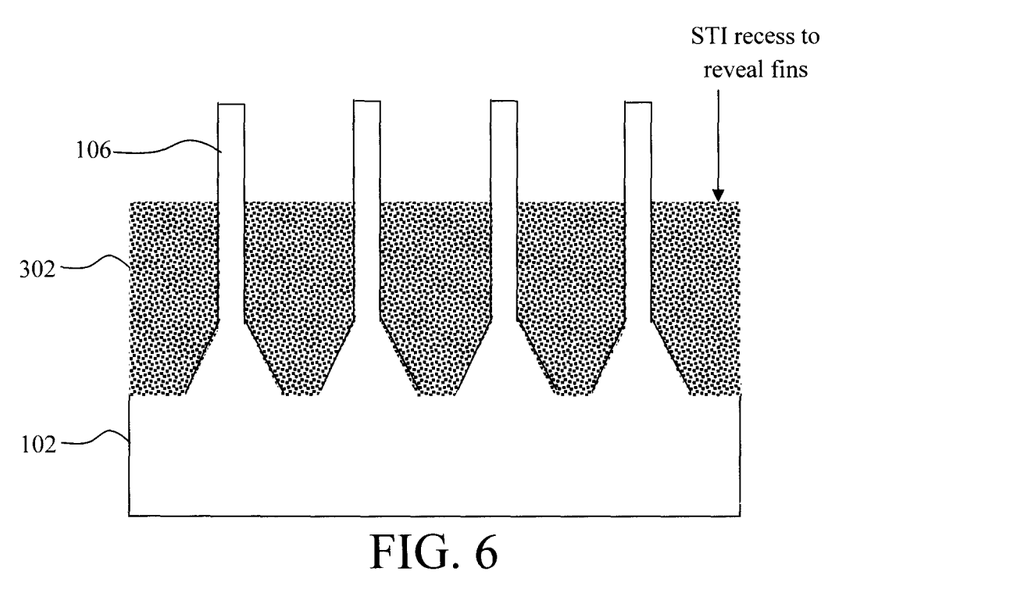
FIG. 6 is a cross-sectional diagram illustrating the oxide and the thermal oxide having been recessed to reveal a portion of the fins according to an embodiment of the present invention.

As shown in FIG. 5, once deposited, the oxide 502 can then be polished back to the fin hardmasks 104 providing a planar surface. This polishing may be performed using, e.g., chemical-mechanical polishing or CMP.

The oxide 502 and thermal oxide 302 can then be recessed to reveal a portion of the fins 106. See FIG. 6. The oxide 502 and thermal oxide 302 can be recessed using a standard STI recess etch. For instance, a timed etch using an oxide-selective RIE chemistry would be suitable. As will be described in detail below, the portions of the fins exposed during this recess etch can be used as the fin channels in field effect transistor (FET) device. Thus it may also be desirable to remove the fin hardmasks 104 at this stage in the process to permit access to the tops of the fins.

As a result of the above-described process, a thermal oxide 302 STI fill is formed between and isolating the fins 106 in a bulk substrate. Advantageously, as provided above, the thermal oxide 302 STI fill does not contain any voids, even when formed in high aspect ratio STI trenches, since the STI oxide is grown rather than deposited into the STI trenches.

It is also possible to use the present thermal oxide-based STI process in conjunction with a standard STI fill. An example of such an embodiment is now described. The process begins in the same manner as described above with a bulk substrate 102, and fins 106 (and trenches 108) having been formed in the bulk substrate (i.e., using direct patterning, SIT, etc.). Suitable bulk substrate materials were provided above. Thus, the structure as depicted in FIG. 1 is the same starting structure for the present exemplary embodiment. As described above, since the present process involves a thermal oxidation of the fins sidewalls, it is desirable to initially pattern fins that are thicker than the final desired fin width. This extra thickness will compensate for the portions of the fin sidewalls consumed during the thermal oxidation process. Specifically, as provided above, the fins 106 may be patterned having a width $W_{initial}$ (see FIG. 1) that is from about 10% to about 30%, and ranges therebetween, greater than the desired final width of the fins. According to an exemplary embodiment, the fins have a starting width $W_{initial}$ of from about 5 nm to about 100 nm, and ranges therebetween, and a final width of from about 2 nm to about 90 nm, and ranges therebetween. As also provided above, in order to protect the fins during the subsequent thermal oxidation process, it is desirable to leave the fin hardmasks 104 in place following the fin etch which will prevent any undesirable loss in fin height through the oxidation process.

Figure 7:
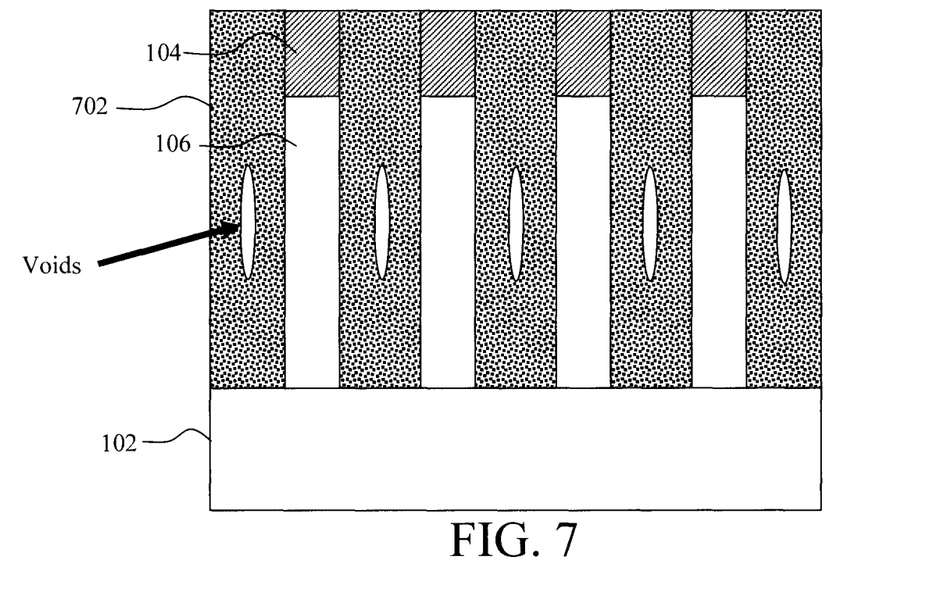
FIG. 7, which follows from FIG. 1, is a cross-sectional diagram illustrating, according to an alternative embodiment, an STI oxide having been deposited into the trenches with void formation according to an embodiment of the present invention.

Referring now to FIG. 7 (which in this alternative embodiment follows from FIG. 1), a standard STI oxide 702 is deposited into the trenches 108. By way of example only, the STI oxide can be deposited into the trenches using a conformal deposition process such as chemical vapor deposition (CVD) or atomic layer deposition (ALD). Use of a conformal deposition process can provide a greater coverage of material in the trenches. However, as shown in FIG. 7, voids can undesirably form with a deposited STI oxide, especially in the case of high-aspect ratio trenches (see above). Specifically, as the STI oxide is deposited into the trenches, material starts to build up on the trench sidewalls. This material build up can close off the opening of the trenches before the trenches are completely filled. These unfilled spaces in the trenches are what are shown as voids in FIG. 7. Ideally, it is desirable to have a STI trench completely filled with a uniform STI oxide, without voids and/or film interfaces, etc.

Excess STI oxide fill can be removed. See FIG. 7 where the STI oxide 702 has been polished back to the surface of the fin hardmasks 104. The STI oxide 702 may be polished using a process such as CMP.

The next task is to fill the voids within the STI oxide 702. Since the openings to the trenches 108 are now occluded by the deposited material, one cannot simply deposit more material to fill the voids. However, advantageously, it has been found by way of the present thermal oxidation-based techniques that one may now grow a thermal oxide that will fill the voids in the trenches. As described above, the present thermal oxidation process involves growing a thermal oxide on the fin sidewalls to fill the trenches 108. Advantageously, the oxygen ions are able to permeate the STI oxide such that the thermal oxide will form until the trenches are completely filled. Thus, even though the openings to the trenches may be closed off (such as in the instant example by way of the deposited STI oxide), thermal oxide growth can continue until the trenches are completely filled with oxide.

Figure 8:
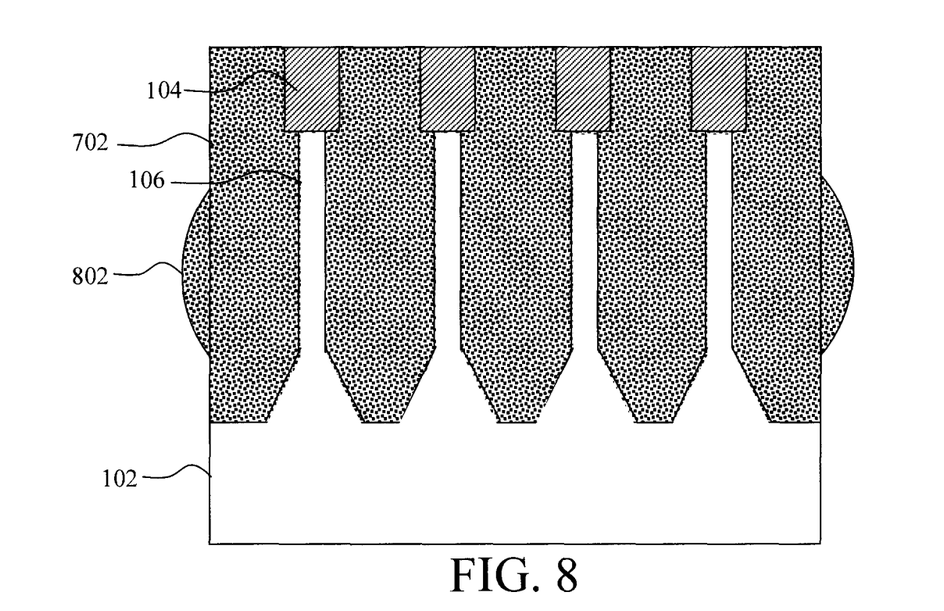
FIG. 8 is a cross-sectional diagram illustrating a thermal oxidation process having been performed to oxidize the sidewalls of the fins forming a thermal oxide within the trenches, and filling any voids left by the STI oxide deposition according to an embodiment of the present invention.

As shown in FIG. 8, a thermal oxidation process is then performed to oxidize the sidewalls of the fins 106 forming a thermal oxide 802 within the trenches 108, and filling any voids left by the STI oxide deposition. As provided above, this thermal oxidation process is carried out by annealing the substrate in an oxygen ambient under conditions sufficient to form the thermal oxide 802 on the sidewalls of the fins 106 and completely filling the trenches 108 (i.e., by filling the voids in the trenches). According to an exemplary embodiment, the thermal oxidation is carried out at a temperature of from about 750° C. to about 1,500° C., and ranges therebetween, for a duration of from about 10 seconds to about 10 hours, and ranges therebetween. As shown in FIG. 8, and as described above, a portion of the fin sidewalls will be consumed during the thermal oxidation process. As such the width of the fins 106 post-oxidation is less than the starting fin width. Thicker fins 106 are preferably patterned to compensate for this loss in width. See above.

The remainder of the process can be performed in the same manner as described above. For instance, an oxide 502 can be deposited to fill the gaps between the fins hardmasks 104, and then polished back. See FIG. 5, described above. The thermal oxide 302 and the oxide 502 can be recessed to reveal the fin channels, and so on. See FIG. 6.

Figure 9:
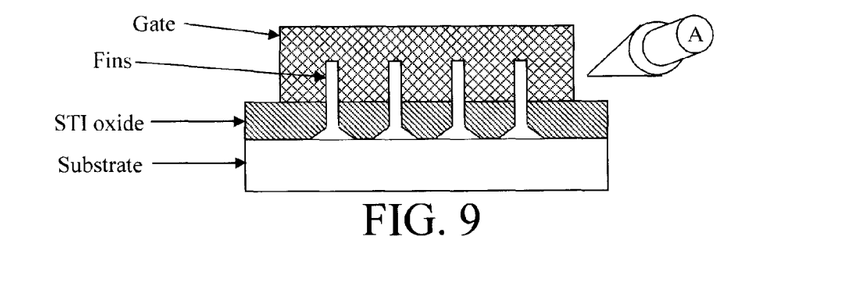
FIG. 9 is a cross-sectional diagram illustrating, in an exemplary process for forming a fin field-effect transistor (finFET) device, a gate having been formed over a portion of each of the fins that will serve as channel regions of the finFET device according to an embodiment of the present invention.

As provided above, the present bulk fin structure with STI isolation can be used, according to an exemplary embodiment, as the basis for forming a finFET device. An exemplary finFET device embodiment is now described. As shown in FIG. 9, the present fin structure includes multiple fins 106 patterned in a bulk substrate 102, and an STI oxide (for example, a thermal oxide) forming isolation regions in between the fins.

A gate(s) is next formed over a portion of each of the fins 502 that will serve as channel regions of the finFET device. See FIG. 9. A standard gate-first or gate-last process may be used to form the gate. Suitable gate materials include, but are not limited to, doped poly silicon and/or a metal or combination of metals.

Figure 10:
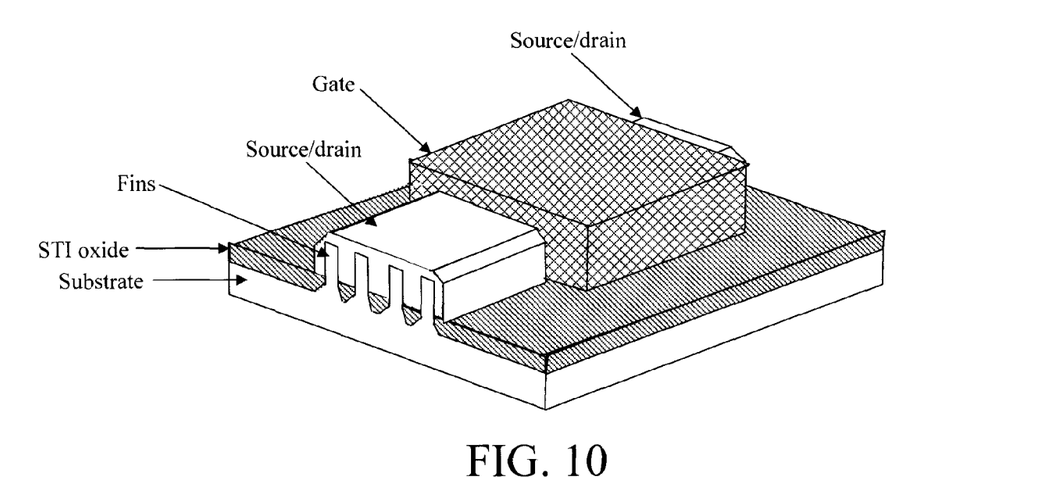
FIG. 10 is a three-dimensional diagram illustrating source and drain regions of the finFET device having been formed on portions of the fins extending out from the gate according to an embodiment of the present invention.

Next, as shown in FIG. 10, source and drain regions of the finFET devices can then be formed on portions of the fins extending out from the gate. FIG. 10 provides a three-dimensional view of the fin FET devices from viewpoint A (see FIG. 9). Standard processes may be employed to form the source and drain regions. By way of example only, the source and drain regions may be formed from an in-situdoped epitaxial material, such as in-situ-doped epitaxial silicon or silicon germanium. Suitable n-type dopants include but are not limited to phosphorous (P), and suitable p-type dopants include but are not limited to boron (B). The use of an in-situ doping process is however only an example. For instance, one may instead employ an ex-situ process such as ion implantation to introduce dopants into the source and drain regions of the finFET devices.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a fin device in a bulk substrate, the method comprising the steps of:
   forming fins and trenches in between the fins in the bulk substrate, wherein the fins are formed having an initial width $W_{initial}$ that is from about 10% to about 30%, and ranges therebetween, greater than a desired final width of the fins of from about 2 nm to about 90 nm, and ranges therebetween, to compensate for fin width lost during formation of a thermal oxide; and
   annealing the bulk substrate in an oxygen ambient under conditions sufficient to form the thermal oxide on sidewalls of the fins which completely fills the trenches and is void-free, wherein the thermal oxide forms a shallow trench isolation (STI) region between each of the fins, and wherein a base of each of the fins has a faceted shape due to the annealing being used to form the thermal oxide that completely fills the trenches.

2. The method of claim 1, wherein the trenches have a width of from about 5 nm to about 500 nm, and ranges therebetween, and a depth of from about 10 nm to about 1 µm, and ranges therebetween.

3. The method of claim 1, wherein $W_{initial}$ is from about 5 nm to about 100 nm, and ranges therebetween.

4. The method of claim 1, wherein the step of forming fins and the trenches in between the fins in the bulk substrate comprises the steps of:
   forming fin hardmasks on the bulk substrate; and
   patterning the fins and the trenches in between the fins in the bulk substrate using the fin hardmasks,
   wherein the fin hardmasks are kept in place on top of the fins while performing the annealing step.

5. The method of claim 1, further comprising the step of:
   forming a conformal oxide liner on the fins prior to performing the annealing step.

6. The method of claim 5, wherein the conformal oxide liner has a thickness of from about 1 nm to about 5 nm, and ranges therebetween.

7. The method of claim 1, wherein the conditions sufficient to form the thermal oxide comprise a temperature of from about 750° C. to about 1,500° C., and ranges therebetween.

8. The method of claim 1, wherein the conditions sufficient to form the thermal oxide comprise a duration of from about 10 seconds to about 10 hours, and ranges therebetween.

9. The method of claim 1, further comprising the steps of:
   recessing the thermal oxide to expose the fins;
   forming a gate over a portion of each of the fins that serve as a channel region of the fin device; and
   forming source and drain regions on portion of the fins extending out from the gate.

10. A method of forming a fin device in a bulk substrate, the method comprising the steps of:
    forming fins and trenches in between the fins in the bulk substrate, wherein the fins are formed having an initial width $W_{initial}$ that is from about 10% to about 30%, and ranges therebetween, greater than a desired final width of the fins of from about 2 nm to about 90 nm, and ranges therebetween, to compensate for fin width lost during formation of a thermal oxide;
    depositing an STI oxide into the trenches, wherein the STI oxide partially fills the trenches such that voids are present within the trenches; and
    annealing the bulk substrate in an oxygen ambient under conditions sufficient to form the thermal oxide on sidewalls of the fins and filling the voids present within the trenches, wherein STI oxide and the thermal oxide form a STI region between each of the fins.

11. The method of claim 10, wherein the trenches have a width of from about 5 nm to about 500 nm, and ranges therebetween, and a depth of from about 10 nm to about 1 µm, and ranges therebetween.

12. The method of claim 10, wherein $W_{initial}$ is from about 5 nm to about 100 nm, and ranges therebetween.

13. The method of claim 10, wherein the conditions sufficient to form the thermal oxide comprise a temperature of from about 750° C. to about 1,500° C., and ranges therebetween.

14. The method of claim 10, wherein the conditions sufficient to form the thermal oxide comprise a duration of from about 10 seconds to about 10 hours, and ranges therebetween.

15. The method of claim 10, further comprising the steps of:
    recessing the STI oxide and the thermal oxide to expose the fins;
    forming a gate over a portion of each of the fins that serve as a channel region of the fin device; and
    forming source and drain regions on portion of the fins extending out from the gate.

16. The method of claim 1, wherein the faceted shape comprises a (111) crystallographic plane at the base of each of the fins.

* * * * *